United States Patent
Kreiter et al.

(10) Patent No.: US 9,412,933 B2
(45) Date of Patent: Aug. 9, 2016

(54) METHOD FOR PRODUCING AN ACTUATOR UNIT AND SLEEVE FOR RECEIVING A PIEZOACTUATOR

(75) Inventors: Johann Kreiter, Deutschlandsberg (AT); Siegfried Fellner, St. Georgen (AT); Georg Kügerl, Eibiswald (AT)

(73) Assignee: EPCOS AG, Munich (DE)

( * ) Notice: Subject to any disclaimer, the term of this patent is extended or adjusted under 35 U.S.C. 154(b) by 349 days.

(21) Appl. No.: 13/883,277

(22) PCT Filed: Oct. 26, 2011

(86) PCT No.: PCT/EP2011/068756
§ 371 (c)(1),
(2), (4) Date: Jul. 16, 2013

(87) PCT Pub. No.: WO2012/059378
PCT Pub. Date: May 10, 2012

(65) Prior Publication Data
US 2013/0285509 A1    Oct. 31, 2013

(30) Foreign Application Priority Data
Nov. 2, 2010    (DE) .......................... 10 2010 050 265

(51) Int. Cl.
*B29C 45/14* (2006.01)
*H01L 41/23* (2013.01)
*H01L 41/053* (2006.01)
*H01L 41/083* (2006.01)

(52) U.S. Cl.
CPC .............. *H01L 41/23* (2013.01); *H01L 41/053* (2013.01); *H01L 41/0533* (2013.01); *H01L 41/083* (2013.01); *Y10T 29/42* (2015.01)

(58) Field of Classification Search
CPC .............. B29C 45/14; B29C 45/14467; B29C 45/14491; B29C 45/14639
See application file for complete search history.

(56) References Cited

U.S. PATENT DOCUMENTS

| | | |
|---|---|---|
| 2004/0113525 A1 | 6/2004 | Hardy et al. |
| 2006/0170310 A1 | 8/2006 | Leo et al. |
| 2010/0052214 A1 | 3/2010 | Leo et al. |

FOREIGN PATENT DOCUMENTS

| | | |
|---|---|---|
| DE | 197 15 487 A1 | 10/1998 |
| DE | 199 10 111 A1 | 10/2000 |
| DE | 101 33 151 A1 | 1/2003 |
| DE | 10 2004 011 696 A1 | 9/2005 |

(Continued)

*Primary Examiner* — Christina Johnson
*Assistant Examiner* — Xue Liu
(74) *Attorney, Agent, or Firm* — McDermott Will & Emery LLP

(57) ABSTRACT

The invention relates to a method for producing an actuator unit comprising a piezoactuator (1), a sleeve (9) having a first end face (14) and a second end face (13), and a potting compound (11). The method comprises: inserting the piezoactuator (1) into the sleeve (9), wherein the piezoactuator is inserted into the sleeve (9) from the side of the sleeve (9) having the first end face (14); arranging a filling opening of a filling element (15) in an axial position near the axial position of the second end face (13) of the sleeve (9); filling a hollow space between the inner side of the sleeve (9) and the piezoactuator (1) with the potting compound (11) via the filling opening of the filling element (15), such that the potting compound (11) extends maximally to a first end face (14') of the piezoactuator (1). The invention further relates to a sleeve (9) for receiving a piezoactuator (1).

11 Claims, 2 Drawing Sheets

(56) References Cited

FOREIGN PATENT DOCUMENTS

| DE | 10 2004 031 404 A1 | 2/2006 |
| DE | 10 2005 025 137 A1 | 12/2006 |
| DE | 10 2006 025 177 A1 | 12/2007 |
| DE | 10 2007 004 552 A1 | 7/2008 |
| DE | 102007026137 A1 * | 12/2008 | .......... H01L 41/0533 |
| DE | 10 2008 003 821 A1 | 7/2009 |
| JP | 2006286797 A | 10/2006 |
| JP | 2008300466 A | 12/2008 |
| WO | 2006/128842 A1 | 12/2006 |

* cited by examiner

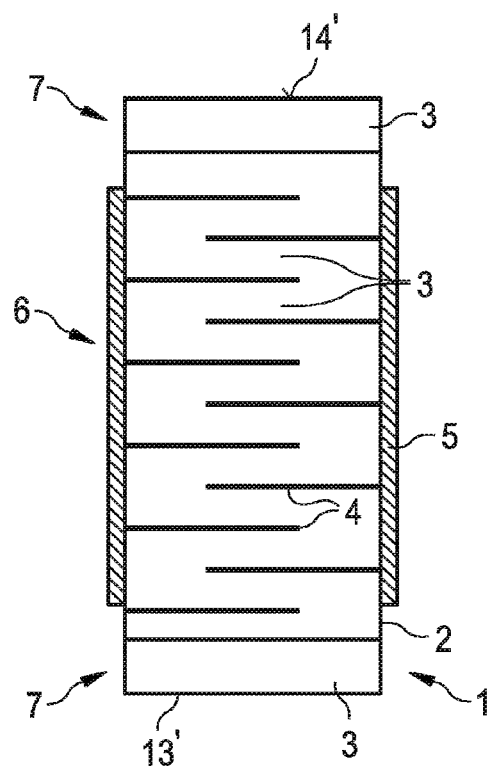
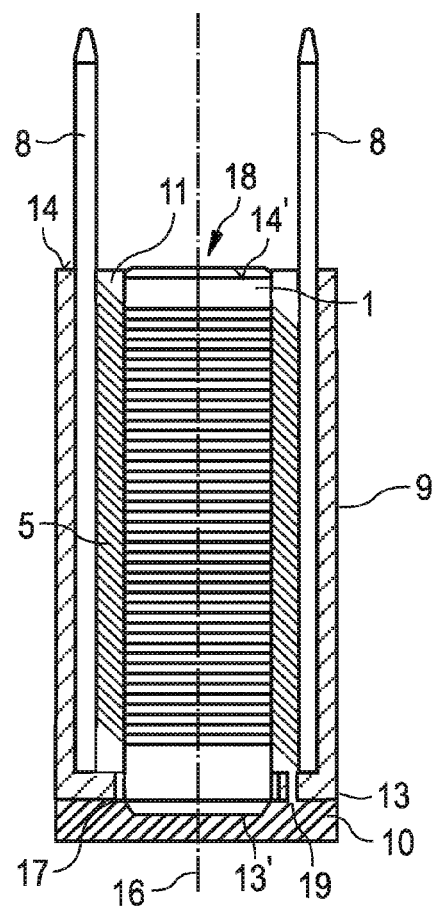

METHOD FOR PRODUCING AN ACTUATOR UNIT AND SLEEVE FOR RECEIVING A PIEZOACTUATOR

A method for producing an actuator unit and a sleeve for receiving a piezo actuator are provided.

Piezo actuators often comprise multiple layers of a piezoelectric material. Piezo actuators can be used, for example, to actuate an injection valve in a motor vehicle. A sleeve is important to protect a piezo actuator from environmental influences when it is desirable to extend the lifetime of the piezo actuator for as long as possible.

Piezo actuators are known, for example, from DE 10 2004 031 404 and DE 10 2006 025 177 A1.

One object is to provide a novel method for producing an actuator unit or a novel sleeve whereby in particular the reliability and the lifetime of a piezo actuator are increased.

A method for producing an actuator unit is provided. The actuator unit has a piezo actuator. The actuator unit has a sleeve with a first end face or end side and a second end face or end side. The actuator unit has a casting compound. In a first step, the piezo actuator is inserted into the sleeve. The piezo actuator is here inserted into the sleeve from the first end face or end side of the sleeve. In a second step, a filling orifice of a filling element, for example the orifice of a needle, is arranged in an axial position close to or in the region of the axial position of the second end face or end side of the sleeve. In particular, the filling orifice is arranged closer to the second end face or end side of the sleeve than to the first end face or end side of the sleeve. The axial position can refer to the main axis of the sleeve. The main axis or the main longitudinal axis extends between the first end face or end side and the second end face or end side of the sleeve. In a third step, a cavity that is formed between an inner side of the sleeve and the piezo actuator is filled with the casting compound via the filling orifice of the filling element. The cavity is thus filled in such a way that the casting compound reaches no further than a first end face of the piezo actuator. The first end face of the piezo actuator is arranged closer to the first end face or end side of the sleeve than a second end face of the piezo actuator.

Two connecting elements are, for example, provided on the piezo actuator. The connecting elements are used for external contacting of the actuator. The connecting elements can be arranged, for example, on the side faces of the piezo actuator. One connecting element is preferably attached in each case to two side faces of the piezo actuator. The connecting elements project, for example, beyond the first end face of the piezo actuator.

The axial position of the filling orifice close to or in the region of the axial position of the second end face or end side of the sleeve is advantageously chosen such that turbulences in the casting compound, that may for example result in undesired air pockets in the casting compound when amplified, can be avoided during the filling process.

The casting compound is inserted into the sleeve in such a way that the casting compound encloses the piezo actuator as completely as possible. The casting compound is preferably inserted into the sleeve in such a way that the casting compound finishes flush with the first end face of the piezo actuator. In particular, the filling is stopped at the latest when the casting compound finishes flush with the first end face of the piezo actuator. It is thereby prevented that any casting compound exceeds the level of the first end face of the piezo actuator. It is thereby prevented that the first end face of the piezo actuator and/or the connecting elements projecting from the first end face of the actuator in order to contact the piezo actuator are covered by the casting compound. This contributes to an increased lifetime and reliability of the actuator unit, in particular of the piezo actuator. Automation of the production of the actuator unit is additionally facilitated because there is no need for expensive cleaning processes on the first end face and/or the connecting elements that can sometimes not be performed automatically.

In an advantageous embodiment, the second end face or end side of the sleeve forms a bottom of the sleeve. The second end face or end side advantageously has an orifice. The piezo actuator is inserted into the sleeve such that the piezo actuator enters the orifice.

The second end face of the piezo actuator is in particular inserted into or through the orifice. The orifice is, for example, an opening. The opening is in particular a rectangular opening. The opening has a dimension that corresponds approximately to the dimension of the second end face of the piezo actuator. The dimension of the second end face of the piezo actuator is preferably smaller than or no greater than the dimension of the opening so that the second end face of the piezo actuator can be inserted easily into the opening. Owing to manufacturing tolerances, a gap can be formed between the orifice on the second end side of the sleeve and the piezo actuator. Casting compound could escape from the sleeve via the orifice in the bottom of the sleeve when the actuator unit is sealed.

In an advantageous embodiment, the method also comprises the step of arranging a sealing element on the second end face or end side of the sleeve preferably removably. The sealing element serves to seal off the sleeve on the side of the second end face or end side. The sealing element is applied before the cavity is filled.

The sealing element is preferably arranged on the second end face or end side of the sleeve in such a way that an escape of the casting compound via the orifice of the second end face or end side of the sleeve is prevented during the filling of the cavity. The sealing element can be applied, for example, after the piezo actuator has been inserted into the sleeve and before the filling orifice is arranged in the cavity.

In an advantageous embodiment, the method also comprises the step of curing the casting compound. In a further step, the sealing element is removed from the second end face or end side of the sleeve after the curing process.

Because the sealing element is expediently applied removably, it can be removed simply in an automatic production step.

In an advantageous embodiment, the filling element is inserted into the sleeve from the first end face or end side of the sleeve.

The filling element is thus guided preferably from the side of the first end face or end side of the sleeve along the piezo actuator toward the second end face or end side of the sleeve.

In an advantageous embodiment, during the filling of the cavity with the casting compound, the filling element is moved away from the second end face or end side of the sleeve toward the first end face or end side of the sleeve and thus away from the second end face or end side of the sleeve.

In particular, the filling orifice of the filling element is advantageously kept above or just below the level of the casting compound in the cavity during the filling of the cavity. Here "above or just below the level of the casting compound" advantageously means 1 to 2 mm above or below the level of the casting compound. Because the filling element is guided in this way, turbulences in the casting compound, that may for example result in undesired air pockets in the casting compound when amplified, can be avoided.

In a further advantageous embodiment, the filling element is inserted into the sleeve from the second end face or end side of the sleeve.

For this purpose, the second end face or end side of the sleeve advantageously has at least one filler orifice, for example a bore hole. In order to fill the cavity with the casting compound, the filling element, in particular the filling orifice of the filling element, is inserted into the cavity via the filler orifice in the second end face or end side. In particular, the filling orifice of the filling element is inserted into a first side of the sealing element and emerges again on a second side of the sealing element. The second side of the sealing element advantageously corresponds to the side of the sealing element that adjoins the cavity of the sleeve.

The filler orifice differs from the orifice that has already been described above and through which the piezo actuator is guided. The filler orifice has a dimension that differs from the dimension of the above described orifice. In particular, the filler orifice has a smaller dimension that the above described orifice through which the piezo actuator is guided. The at least one filler orifice is offset radially relative to the above described orifice in the second end face or end side of the sleeve, with respect to the main axis of the actuator unit or the sleeve. As a result, the filling element can be guided along the piezo actuator when it is inserted into the cavity. After the filling element has been inserted into the cavity, the casting compound is pressed from the side of the second end face or end side toward the first end face or end side of the sleeve. In this process, the filling element remains stationary, for example. As a result, turbulences and hence air pockets in the casting compound can be largely avoided. This contributes to increasing the lifetime of the actuator unit.

In an advantageous embodiment, the piezo actuator is inserted into the sleeve in such a way that the first end face of the piezo actuator and the first end face or end side of the sleeve have the same axial position with respect to the main axis.

The height or length of the sleeve advantageously correspond approximately to the height of the piezo actuator. As a result, it is possible to ensure that the casting compound finishes flush with the first end face of the piezo actuator and at the same time with the first end face or end side of the sleeve. As a result, the stability and lifetime of the actuator unit are increased. Automatic manufacturing of the actuator unit can be facilitated because the casting compound is always filled up to a specified level, i.e. no higher than the first end face of the piezo actuator and thus of the sleeve, and there is no need for expensive work (that would need to be performed in additional steps) to clean casting compound on the first end face of the piezo actuator and on the connecting elements. Manufacturing costs can be reduced in this way.

A sleeve is moreover provided for receiving a piezo actuator. The sleeve has a first end face or end side and a second end face or end side. A first orifice is provided in the second end face or end side. At least one further or second orifice is provided offset radially with respect to a main axis of the sleeve, relative to the first orifice.

The first orifice differs from or is separate from the second orifice. The first orifice has a diameter that differs from the diameter of the second orifice. In particular, the first orifice has a larger diameter than the second orifice. The sleeve is designed to protect the piezo actuator from environmental influences such as, for example, high temperatures that can occur in the engine compartment of a motor vehicle. The sleeve can thus increase the lifetime of the piezo actuator. The sleeve preferably contains a material that has hydrophobic properties. At the same time, the material should have a sufficient mechanical rigidity or stability to ensure that the casting compound retains its shape. Moreover, said material should be resistant to temperatures. The sleeve preferably contains a material comprising a thermoplastic polyester, for example polybutylene terephthalate (PBT). PBT also has the advantage that, because of its chemical stability, the material does not separate from the piezo actuator and chemically contaminates the latter.

In an advantageous embodiment, the first orifice is provided for receiving an end face of a piezo actuator. The at least one further orifice is provided for the insertion of a filling element into an interior space of the sleeve in order to fill the sleeve with a casting compound.

The radial offset between the first and the second orifice enables the filling orifice of the filling element to be inserted along the piezo actuator into the interior space of the sleeve. The second or further orifice is, for example, a bore hole.

In an embodiment, the sleeve is designed in a single piece.

An actuator unit is moreover provided. The actuator unit comprises a piezo actuator. The actuator unit moreover comprises the abovedescribed sleeve. The piezo actuator is arranged at least partially in the first orifice of the sleeve.

In an embodiment, the actuator unit has a casting compound enclosing the piezo actuator. The piezo actuator has a first end face and a second end face. The casting compound extends no further than the first end face of the piezo actuator.

In an embodiment, the piezo actuator is arranged at least partially in the first orifice. In particular, the second end face of the piezo actuator can project from the first orifice of the sleeve.

By virtue of the design of the sleeve in a single piece, it can be avoided that the casting compound escapes at the joining points of different sleeve parts. Furthermore, by virtue of the design of the sleeve in a single piece, it can be avoided that the piezo actuator is tilted at the joining points of multiple sleeve parts when the piezo actuator is inserted.

In an advantageous embodiment of the actuator unit, the main axis of the sleeve runs through the first orifice. The piezo actuator is arranged above the first orifice. Just the casting compound is arranged above the further orifice. In particular, there is no casting compound present over the region covered by the piezo actuator, in particular over the region of the first orifice.

The subjects described are explained in detail with the aid of the following exemplary embodiments and drawings, in which:

FIG. 1 shows a schematic view of a piezo actuator,

FIG. 2 shows a schematic view of an actuator unit,

Figure 3:
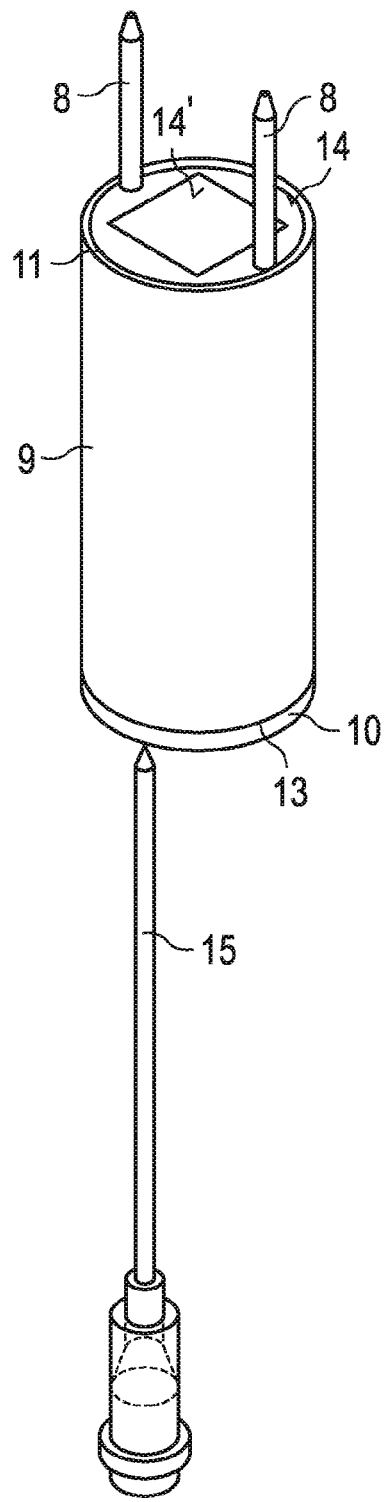
FIG. 3 shows a schematic view of the actuator unit from FIG. 2 during the sealing.

Identical components or those that have the same function can each be provided with the same reference numerals in the exemplary embodiments. The elements shown and their proportions relative to one another should in principle not be viewed as drawn to scale and instead, for the sake of improved presentation and comprehension, individual elements such as, for example, layers, components, structural elements, and regions can be shown with exaggeratedly thick or large dimensions.

FIG. 1 shows a multi-layer piezo actuator 1. The piezo actuator 1 has a stack 2 of multiple piezoelectric layers 3 arranged one above the other. The piezo actuator 1 has a first end face 14' and a second end face 13'.

The stack 2 is divided, in the stack direction, into an active region 6 and two inactive regions 7. The inactive regions 7 adjoin the active region 6 in the stack direction and form the end pieces of the stack 2. The active region 6 of the stack 2 has electrode layers 4 arranged between the piezoelectric layers 3. In order to be able to contact the electrode layers 4 simply in the active region 6, the piezo actuator 1 is designed such that only those electrode layers 4 associated respectively with the same electrical polarity extend as far as an edge region of the piezo actuator 1. Those electrode layers 4 associated with the other electrical polarity do not extend right up to the edge of the piezo actuator 1 at this point. Accordingly, the electrode layers 4 are in each case designed in the form of combs pushed into each other. An electrical voltage can be applied to the electrode layers 4 via contact surfaces in the form of metallizations 5 on the outside of the stack 2. When a voltage is applied to the electrode layers 4, the piezoelectric material in the active region 6 is deformed.

A connecting element 8 designed as a wire or pin (see FIGS. 2 to 4) is in each case attached to the metallizations 5, and enables external electrical contacting of the piezo actuator 1.

FIG. 2 shows a schematic view of an actuator unit. In particular, FIG. 2 shows the actuator unit shortly before completion of its manufacture, which is described in detail in FIGS. 3 and 4.

The actuator unit has a sleeve 9. The sleeve 9 has a cylindrical design. The sleeve 9 is made, for example, from polybutylene terephthalate (PBT). The sleeve 9 is designed as a single piece. The sleeve 9 has a first end face or end side 14 and a second end face or end side 13. The piezo actuator 1 from FIG. 1 is arranged in the sleeve 9. In particular, the piezo actuator 1 is arranged in the sleeve 9 in such a way that the first end face 14' of the piezo actuator 1 is arranged closer to the first end face or end side 14 of the sleeve 9 than the second end face 13' of the piezo actuator 1.

The first end face or end side 14 of the sleeve 9 has an orifice 18. The orifice 18 is designed to receive the piezo actuator 1 inside the interior space of the sleeve 9. The height or length of the sleeve 9 corresponds approximately to the height of the piezo actuator 1. In particular, in this exemplary embodiment the first end face 14' of the piezo actuator 1 finishes flush with the first end face or end side 14 of the sleeve. The first end face 14' of the piezo actuator 1 and the first end face or end side 14 of the sleeve consequently have the same axial position with respect to the main axis 16 of the actuator unit or the sleeve 9, wherein the main axis 16 extends between the first end face or end side 14 and the second end face or end side 13 of the sleeve 9. The connecting elements 8 of the piezo actuator 1 project from the first end face 14' of the piezo actuator 1 and consequently also from the first end face or end side 14 of the sleeve 9.

The second end face or end side 13 of the sleeve 9 forms the bottom of the sleeve 9. The second end face or end side 13 has an orifice 17, in particular an opening. The opening is preferably a rectangular opening. The main axis 16 runs through the orifice 17. The second end face 13' of the piezo actuator 1 is inserted into the orifice 17 and guided through it. In particular, the second end face 13' of the piezo actuator 1 projects from the orifice 17 and thus beyond the second end face or end side 13 of the sleeve 9.

Because of manufacturing tolerances, a space or a gap (not explicitly shown) may occur between the orifice 17 and the piezo actuator 1. Sealing material 11 can escape through this space when the actuator unit is sealed. In order to prevent sealing material 11 escaping from the orifice 17 and consequently from the second end face or end side 13 of the sleeve 9, a sealing element 10 is attached to the second end face or end side 13 of the sleeve 9. The sealing element 10 closes the side of the second end face or end side 13 of the sleeve 9. The sealing element 10 is pressed onto the end face or end side 13 of the sleeve by a machine. The sealing element 10 is attached in a removable fashion. The sealing element 10 is preferably attached only during the sealing of the actuator unit and during a subsequent process of curing the casting compound 11, as will be explained in detail in conjunction with FIGS. 3 and 4.

The sealing element 10 is a sealing disk. The sealing element 10 can be deformed. The sealing element 10 is made from foam. When the sealing element 10 is attached to the second end face or end side 13 of the sleeve 9, the sealing element 10 fits onto the second end face 13' of the piezo actuator 1, projecting from the side of the second end face or end side 13 of the sleeve 9.

The second end face or end side 13 has a further orifice 19 in this exemplary embodiment. The end face or end side 13 can have multiple further orifices 19. The further orifice 19 is offset radially with respect to the orifice 17, relative to the main axis 16. The further orifice 19 is a bore hole, for example. The further orifice 19 serves, for example, to insert a filling element 15 (see FIG. 4 in particular) into the interior space of the sleeve in order to fill the sleeve 9 with the casting compound 11. Casting compound 11 is arranged above the further orifice 19, as can be seen in FIG. 2.

The casting compound 11 encases the piezo actuator 1. The casting compound 11 preferably contains a silicone elastomer. The casting compound 11 can have a quartz sand and adhesion-promoting materials in addition to the silicone elastomer. The casting compound 11 is connected to the outside of the piezo actuator 1, i.e. both to external surfaces of the piezoceramic layers 3 and also to the external surfaces of the metallizations 5 and the connecting elements 8. The casting compound 11 is limited externally by the sleeve 9. In this exemplary embodiment, the casting compound 11 is filled up to the top. In particular, the casting compound 1 finishes flush with the first end face 14' of the piezo actuator 1 and consequently with the first end face or end side 14 of the sleeve 9. In a further exemplary embodiment, the casting compound 11 can also extend as far as a point just below the first end face 14' of the piezo actuator 1. In each case, the casting compound 11 does not exceed the level of the first end face 14' of the piezo actuator 1. In particular, the region of the connecting elements 8 that projects from the first end face 14' of the piezo actuator 1 is free of casting compound 11. As a result, there is no need for expensive work to clean the connecting elements 8 after the actuator unit has been sealed. An automatic production process for the actuator unit is thus facilitated.

Figure 4:
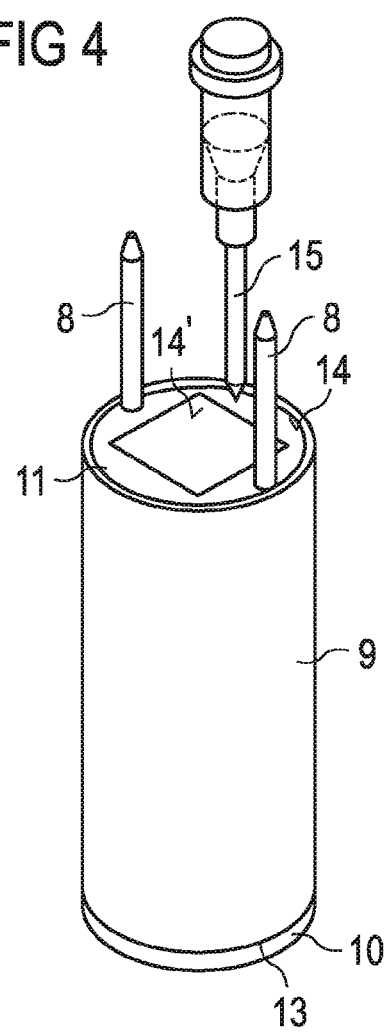
FIG. 4 shows a schematic view of the actuator unit from FIG. 2 during the sealing in a further embodiment.

FIGS. 3 and 4 show the described actuator unit whilst it is being produced, in particular whilst it is being sealed.

In a first step, the piezo actuator 1 is inserted into the sleeve 9 via the orifice 18. The piezo actuator 1 is inserted in such a way that the second end face 13' of the piezo actuator 1 is inserted into the opening 17 so that the second end face 13' of the piezo actuator 1 projects from the second end face or end side 13 of the sleeve 9 (see FIG. 2). The first end face 14' of the piezo actuator 1 finishes flush with the first end face or end side 14 of the sleeve 9, as was described in conjunction with FIG. 2.

In a second step, the above described sealing element 10 is attached removably to the second end face or end side 13 of the sleeve 9, and is preferably pressed on by a machine. The sealing element 10 is attached in such a way that the second end face or end side 13 is sealed off to prevent the casting compound 11 escaping during the sealing, as described in conjunction with FIG. 2. In particular, the gap between the circumferential wall of the orifice 17 and the piezo actuator 1 is sealed off by the sealing element 10.

In a third step, the filling element 15, in particular a filling orifice of the filling element 15, is inserted into the sleeve 9, in particular into the cavity between the inner wall of the sleeve 9 and the piezo actuator 1. The filling orifice is inserted in such a way that the filling orifice is arranged, before beginning to insert the casting compound 11, in an axial position that lies close to the axial position of the second end face or end side 13 of the sleeve 9 with respect to a main axis 16. In particular, the filling orifice is arranged directly above the second end face or end side 13 of the sleeve (not shown explicitly in FIGS. 3 and 4).

The filling element 15 can be inserted into the cavity from the side of the first end face or end side 14 of the sleeve 9, as can be seen in FIG. 4. In particular, in this case the filling orifice 15 is inserted into the cavity via the orifice 18 and advanced along the piezo actuator 1 as far as the first end face or end side 13 of the sleeve 9 (not shown explicitly). In this case, the actuator unit does not have a further orifice 19 on the side of the second end face or end side 13 of the sleeve 9 in order to insert the filling element 15.

Alternatively, the filling element 15 can also be inserted into the cavity from the side of the second end face or end side 13 of the sleeve 9, as can be seen in FIG. 3. To do this, the sleeve 9, in particular the second end face or end side 13 of the sleeve 9, has the at least one further orifice 19 (see FIG. 2) via which the filling element 15 is inserted into the cavity from the side of the second end face or end side 13. When the filling element 15, in particular the filling orifice, is inserted into the cavity via the orifice 19, the sealing element 10 is pierced. Because the sealing element 10 is made from a flexible material, for example foam, the sealing element 10 clings to the filling element 15 in such a way that the casting compound 11 does not escape through the pierced hole. In addition, the pierced hole closes up again automatically after the filling element 15 is removed, as a result of which the casting compound 11 does not escape through the pierced hole during a subsequent curing process, for example. After the filling element 15 has pierced the sealing element 10, the filling orifice of the filling element 15 is arranged directly above the bottom that is formed by the second end face or end side 13 of the sleeve 9.

In a next step, the cavity between the inside of the sleeve 9 and the piezo actuator 1 is filled with the casting compound 11 via the filling orifice of the filling element 15.

If the filling element 15 is inserted via the side of the first end face or end side 14 (FIG. 4), the filling element 15 is moved toward the first end face or end side 14 when the cavity is filled (not shown explicitly) so that the filling element 15, in particular the filling orifice of the filling element 15, is always kept close to the level of the casting compound. Alternatively, the filling orifice of the filling element 15 can also be kept just below the level of the casting compound. The respective arrangement of the filling orifice in close proximity to the level of the casting compound enables the cavity to be filled evenly. Turbulences in the casting compound 11, which can cause air pockets in the cured casting compound 11, are avoided.

If the filling element 15 is inserted via the side of the second end face or end side 13 (FIG. 3), the filling element 15 always remains in the same position whilst the cavity is being filled. In particular, the casting compound 11 is pushed from the side of the second end face or end side 13 of the sleeve 9 toward the side of the first end face or end side 14 of the sleeve 9 by the filling pressure. Even filling of the cavity is thus ensured and turbulences, that can cause air pockets in the cured casting compound 11, are avoided.

The cavity is filled until the casting compound 11 extends as far as the first end face 14' of the piezo actuator 1. As soon as the casting compound 11 has reached the level of the first end face 14' of the piezo actuator 1, the filling process is stopped.

After the cavity has been filled, the filling element 15 is removed. In particular in the exemplary embodiment shown in FIG. 3, the filling element 15 is moved back toward the second end face or end side 13 of the sleeve 9. The filling orifice is then guided out of the orifice 19 and subsequently retracted from the sealing element 10. In the exemplary embodiment shown in FIG. 4, after the filling process is complete, the filling element 15 is already situated in close proximity to the first end face or end side 14 of the sleeve 9 and is drawn toward the first end face or end side 14 and thus removed from the actuator unit.

In a next step, the casting compound 11 is cured. This can be carried out over several hours in an oven at high temperatures.

After the casting compound 11 has been cured, in a final step the sealing element 10 is removed, preferably automatically, from the second end face or end side 13 of the sleeve 9.

LIST OF REFERENCE NUMERALS 1 piezo actuator
2 stack
3 piezoelectric layer
4 electrode layer
5 metallization
6 active region
7 inactive region
8 connecting element
9 sleeve
10 sealing element
11 casting compound
13 end face or end side
14 end face or end side
13' end face
14' end face
15 filling element
16 main axis
17 orifice
18 orifice
19 orifice

The invention claimed is:

1. A method for producing an actuator unit having a piezo actuator, a sleeve with a first end face or end side and a second end face or end side, and a casting compound, wherein the method comprises the following steps:

inserting the piezo actuator into the sleeve, wherein the piezo actuator is inserted into the sleeve from the first end face or end side of the sleeve;

arranging a filling orifice of a filling element in an axial position close to the axial position of the second end face or end side of the sleeve with respect to a main axis of the sleeve;

filling a cavity that is formed between an inner side of the sleeve and the piezo actuator with the casting compound via the filling orifice of the filling element in such a way that the casting compound reaches no further than a first end face of the piezo actuator, wherein the first end face of the piezo actuator is arranged closer to the first end face or end side of the sleeve than a second end face of the piezo actuator;

arranging a sealing element on the second end face or end side of the sleeve in order to seal off the sleeve on the side of the second end face or end side before the cavity is filled;

curing the casting compound; and removing the sealing element from the second end face or end side of the sleeve after the curing process, wherein during the filling of the cavity with the casting compound the filling element is moved away from the second end face or end side of the sleeve toward the first end face or end side of the sleeve.

2. The method according to claim 1, wherein the second end face or end side of the sleeve forms a bottom of the sleeve, the second end face or end side has an orifice, and the piezo actuator is inserted into the sleeve such that the piezo actuator enters the orifice.

3. The method according to claim 2, wherein the sealing element is arranged on the second end face or end side of the sleeve in such a way that emergence of the casting compound from the sleeve via the orifice of the second end face or end side of the sleeve is prevented during the filling of the cavity.

4. The method according to claim 1, wherein the filling element is inserted into the sleeve from the first end face or end side of the sleeve.

5. The method according to claim 1, wherein the filling orifice of the filling element is kept above or just below the level of the casting compound in the cavity during the filling of the cavity.

6. The method according to claim 1, wherein the filling element is inserted into the sleeve from the second end face or end side of the sleeve.

7. The method according to claim 6, wherein the second end face or end side of the sleeve has at least one filler orifice, and wherein, in order to fill the cavity with the casting compound, the filling element is inserted into the cavity via the filler orifice in the second end face or end side.

8. The method according to claim 1 or 6, wherein the filling orifice of the filling element is inserted into a first side of the sealing element and emerges again on a second side of the sealing element.

9. The method according to claim 1, wherein the cavity is filled with the casting compound until the casting compound finishes flush with the first end face of the piezo actuator and the filling process is stopped so that the casting compound does not exceed the level of the first end face of the piezo actuator.

10. The method according to claim 1, wherein the piezo actuator is inserted into the sleeve in such a way that the first end face of the piezo actuator and the first end face or end side of the sleeve have the same axial position with respect to the main axis.

11. The method according to claim 1, wherein the filling element is a needle.

* * * * *